(12) United States Patent
Chung et al.

(10) Patent No.: US 10,197,607 B2
(45) Date of Patent: Feb. 5, 2019

(54) SYSTEM AND METHOD FOR ESTIMATING COMPONENT PARAMETERS

(75) Inventors: Shu-Hung Henry Chung, Hong Kong (HK); Nan Chen, Hong Kong (HK)

(73) Assignee: CITY UNIVERSITY OF HONG KONG, Kowloon (HK)

(*) Notice: Subject to any disclaimer, the term of this patent is extended or adjusted under 35 U.S.C. 154(b) by 594 days.

(21) Appl. No.: 13/532,900

(22) Filed: Jun. 26, 2012

(65) Prior Publication Data

US 2013/0346002 A1    Dec. 26, 2013

(51) Int. Cl.
  *G01R 27/02*   (2006.01)
(52) U.S. Cl.
  CPC .................. *G01R 27/02* (2013.01)
(58) Field of Classification Search
  CPC ...... G06F 19/00; G06F 17/5036; G01R 27/00
  See application file for complete search history.

(56) References Cited

U.S. PATENT DOCUMENTS

| | | | | |
|---|---|---|---|---|
| 2004/0162683 A1* | 8/2004 | Verbrugge et al. | ............. | 702/64 |
| 2009/0079401 A1* | 3/2009 | Mok | .................... | H02M 3/157 323/234 |
| 2010/0295554 A1* | 11/2010 | Alho | ...................... | G01R 31/42 324/548 |

OTHER PUBLICATIONS

Wikipedia, Ohm's law, Jan. 11, 2004.*
Xinbo Liu, Yuanjun Zhou, Wei Zhang, Shuohan Ma, "Stability Criteria for Constant Power Loads With Multistage LC Filters," IEEE Transactions on Vehicular Technology, vol. 60, No. 5, pp. 2042-2049, Jun. 2011.
H. Sira-Ramirez, G. Escobar, and R. Ortega, "On passivity-based s liding mode control of switched DC-to-DC power converters," in Proc. IEEE Conf Decision and Control1996, Kobe, Japan, vol. 3, pp. 2525-2526, Dec. 1996.
K. Leung and H. Chung, "Derivation of a Second-Order Switching Surface in the Boundary Control of Buck Converters," IEEE Power Electronics Letter, vol. 2, No. 2, pp. 63-67, Jun. 2004.
M. Ordonez, J. E. Quaicoe, and M T. Iqbal, "Advanced boundary control of inverters using the natural switching surface: normalized geometrical derivation," IEEE Trans. Power Electron. , vol. 23, No. 6, pp. 2915-2930, Nov. 2008.
T.H. Li and H. Chung, "Output Current Control for Grid-Connected VSI with LCL filter," International Power Electronics Conference—ECCE—Asia, Sapporo Convention Centre, Sapporo, Japan, 2010, Jun. 21-24, 2010, pp. 1665-1670.

* cited by examiner

*Primary Examiner* — Kyle R Quigley
(74) *Attorney, Agent, or Firm* — Renner Kenner Greive Bobak Taylor & Weber

(57) ABSTRACT

A system and a method for estimating component parameters relating to electric components of an electric circuit comprising the steps of receiving one or more sample variables associated with the electric circuit, applying the one or more sample variables to one or more component relationships associated with an arrangement of the electric components of the electric circuit, and processing the one or more component relationships with an approximation process to determine one or more estimated component parameters.

11 Claims, 7 Drawing Sheets

SYSTEM AND METHOD FOR ESTIMATING COMPONENT PARAMETERS

TECHNICAL FIELD

The present invention relates to a system and method for estimating component parameters, and particularly, although not exclusively, a system for estimating component parameters associated with electrical components of a switched-mode power converter.

BACKGROUND

Switched-mode power converters, or sometimes known as switched-mode power supply units, are power supply units which are generally used on sophisticated electronic equipment which requires a controlled, constant and regulated power supply. To produce such a controlled and regulated power supply, these switched-mode power supply units include a switching circuit to process an incoming electrical current so as to recreate a controlled and regulated electric current independent of the electricity supplied from a primary power source.

In some examples, the switching circuit may be arranged to process the incoming electrical current by switching it on and off, or in opposite directions, at a very high frequency so as to create a very fine and constant waveform of electrical current. As this waveform of electrical current is artificially recreated by the switching module, the quality and attributes of the electrical waveform can be controlled and regulated as desired by a user. In many instances, this waveform of electrical current may also then be filtered by an output filter so that excessive noise or undesirable interferences from the switching circuit may be removed before the electrical current is supplied to an electronic or electrical device.

In these examples, the switching circuit may be controlled by a controller which is programmed to perform the switching of the incoming electrical current so as to create the desired regulated power for the user. However, control methods which are programmed within the controller system may not be able to respond to changing loads being placed on the switched-mode power supply and thus, reduce the performance of the switched-mode power supply. In some advanced designs where the switching circuit is able to receive feedback so as to cater for changing loads, the changes to the characteristics of the components within the power supply due to different reasons like aging or parametric drift may nonetheless reduce the efficiency and performance of the switched-mode power supply.

SUMMARY OF THE INVENTION

In accordance with a first aspect of the present invention, there is provided a method for estimating component parameters relating to electric components of an electric circuit comprising the steps of:
  receiving one or more sample variables associated with the electric circuit;
  applying the one or more sample variables to one or more component relationships associated with an arrangement of the electric components of the electric circuit; and
  processing the one or more component relationships with an approximation process to determine one or more estimated component parameters.

In an embodiment of the first aspect, the electric circuit is a filter.

In an embodiment of the first aspect, the electric circuit is a LC filter comprising one or more inductors and one or more capacitors.

In an embodiment of the first aspect, the one or more estimated component parameters include
  a capacitance value associated with each of the one or more capacitors;
  an inductance value associated with each of the one or more inductors;
  a series resistance value associated with each of the one or more inductors; or
  any one or more thereof.

In an embodiment of the first aspect, the one or more sample variables are associated with an input current to the electric circuit, an output current to the electric circuit and node voltages of one or more nodes of the electric circuit.

In an embodiment of the first aspect, the one or more nodes of the electric circuit are defined by an electrical joint between a capacitor and an inductor.

In an embodiment of the first aspect, the approximation process is a recursive least square process.

In an embodiment of the first aspect, the one or more component relationships include a capacitance relationship arranged to be applied with the recursive least square process to derive one or more capacitance value associated with each of the one or more capacitors.

In an embodiment of the first aspect, the capacitance relationship is given by:

$$i_{in} - i_{out} = C_1 \frac{d(v_1 - v_{rc1})}{dt} + C_2 \frac{d(v_2 - v_{rc2})}{dt} + \ldots C_n \frac{d(v_n - v_{rcn})}{dt};$$

wherein:
  $i_{in}$ is the input current to the electric circuit;
  $i_{out}$ is the output current to the electric circuit; and
  $V_n$ is the node voltages of one or more nodes of the electric circuit.
  $(V_{rcn})$ is the voltages of one or more equivalent series resistance (ESR) of the capacitors.

In an embodiment of the first aspect, the one or more capacitance value associated with each of the one or more capacitors is applied to an inductor current relationship to derive one or more inductor current values associated with each of the one or more inductors.

In an embodiment of the first aspect, the inductor current relationship is given by:

$$i_{n+1} = i_n - C_n \frac{dv_n}{dt}$$

wherein:
  $i_{n+1}$ is the input current to a next inductor in series;
  $i_n$ is the output current to the inductor;
  $C_n$ is the capacitance value of the capacitor associated with the inductor; and
  $dv_n/dt$ is the change in voltage across the capacitor over time.

In an embodiment of the first aspect, the one or more inductor current values inductor associated with each of the one or more inductors is applied to an inductance relationship to derive one or more inductance values and series resistance values associated with each of the one or more inductors.

In an embodiment of the first aspect, defining $$\Delta i_n(t) = i_n(t) - i_n(0) \text{ and}$$

$$V_{Ln}(t) = V_{n-1}(t) - V_n(t),$$

the inductance relationship is given by:

$$L_n \Delta i_n(t_1) = \int_0^{t_1} [V_{Ln}(t) - r_{Ln} i_n(t)] dt$$

wherein:
- $L_n$ is the inductance of the inductor;
- $i_n$ is the current flowing into the inductor;
- t is the time variable;
- $V_{Ln}$ is the potential difference across the inductor; and
- $r_{Ln}$ is the series resistance of the inductor.

In an embodiment of the first aspect, the inductance relationship is processed by the recursive least squares process to derive the one or more inductance values and the series resistance values associated with each of the one or more inductors.

In an embodiment of the first aspect, the one or more estimated component parameters are provided to a controller arranged to control a switching module of a switched mode power supply.

In accordance with a second aspect of the present invention, there is provided a system for estimating component parameters relating to electric components of an electric circuit comprising:
- a sampling module arranged to obtain one or more sample variables associated with the electric circuit;
- a routine arranged to apply the one or more sample variables to one or more component relationships associated with an arrangement of the electric components of the electric circuit; and
- a processor arranged to process the one or more component relationships with an approximation process to determine one or more estimated component parameters.

In an embodiment of the second aspect, the one or more component relationships is associated with an arrangement of the electric components of the electric circuit In an embodiment of the second aspect, the electric circuit is a filter.

In an embodiment of the second aspect, the electric circuit is a LC filter comprising one or more inductors and one or more capacitors.

In an embodiment of the second aspect, the one or more estimated component parameters include
- a capacitance value associated with each of the one or more capacitors;
- an inductance value associated with each of the one or more inductors;
- a series resistance value associated with each of the one or more inductors; or
- any one or more thereof.

In an embodiment of the second aspect, the one or more sample variables are associated with an input current to the electric circuit, an output current to the electric circuit and node voltages of one or more nodes of the electric circuit.

In an embodiment of the second aspect, the one or more nodes of the electric circuit are defined by an electrical joint between a capacitor and an inductor.

In an embodiment of the second aspect, the approximation process is a recursive square process.

In an embodiment of the second aspect, the one or more component relationships include a capacitance relationship arranged to be applied with the recursive least square process to derive one or more capacitance value associated with each of the one or more capacitors.

In an embodiment of the second aspect, the capacitance relationship is given by:

$$i_{in} - i_{out} = C_1 \frac{d(v_1 - v_{rc1})}{dt} + C_2 \frac{d(v_2 - v_{rc2})}{dt} + \ldots C_n \frac{d(v_n - v_{rcn})}{dt};$$

wherein:
- $i_{in}$ is the input current to the electric circuit;
- $i_{out}$ is the output current to the electric circuit; and
- $V_n$ is the node voltages of one or more nodes of the electric circuit.
- $V_{rcn}$ is the voltages of one or more equivalent series resistance (ESR) of the capacitors.

In an embodiment of the second aspect, the one or more capacitance value associated with each of the one or more capacitors is applied to an inductor current relationship to derive one or more inductor current values associated with each of the one or more inductors.

In an embodiment of the second aspect, the inductor current relationship is given by:

$$i_{n+1} = i_n - C_n \frac{dv_n}{dt}$$

wherein:
- $i_{n+1}$ is the input current to a next inductor in series;
- $i_n$ is the output current to the inductor;
- $C_n$ is the capacitance value of the capacitor associated with the inductor; and
- $dv_n/dt$ is the change in voltage across the capacitor over time.

In an embodiment of the second aspect, the one or more inductor current values inductor associated with each of the one or more inductors is applied to an inductance relationship to derive one or more inductance values and series resistance values associated with each of the one or more inductors.

In an embodiment of the second aspect, defining $$\Delta i_n(t) = i_n(t) - i_n(0) \text{ and}$$

$$V_{Ln}(t) = V_{n-1}(t) - V_n(t),$$

the inductance relationship is given by:

$$L_n \Delta i_n(t_1) = \int_0^{t_1} [V_{Ln}(t) - r_{Ln} i_n(t)] dt$$

wherein:
- $L_n$ is the inductance of the inductor;
- $i_n$ is the current flowing into the inductor;
- t is the time variable;
- $V_{Ln}$ is the potential difference across the inductor; and
- $r_{Ln}$ is the series resistance of the inductor.

In an embodiment of the second aspect, the inductance relationship is processed by the recursive least squares process to derive the one or more inductance values and the series resistance values associated with each of the one or more inductors.

In an embodiment of the second aspect, the one or more estimated component parameters are provided to a controller arranged to control a switching module of a switched mode power supply.

In accordance with a third aspect of the present invention, there is provided a switched-mode power supply comprising a system for estimating component parameters in accordance with any one of the second aspect.

In accordance with a fourth aspect of the present invention, there is provided a method for controlling a switched-mode power supply comprising the method for estimating component parameters in accordance with any one of the first aspect.

BRIEF DESCRIPTION OF THE DRAWINGS

Embodiments of the present invention will now be described, by way of example, with reference to the accompanying drawings in which.

DETAILED DESCRIPTION OF ILLUSTRATIVE EMBODIMENTS

Figure 1:
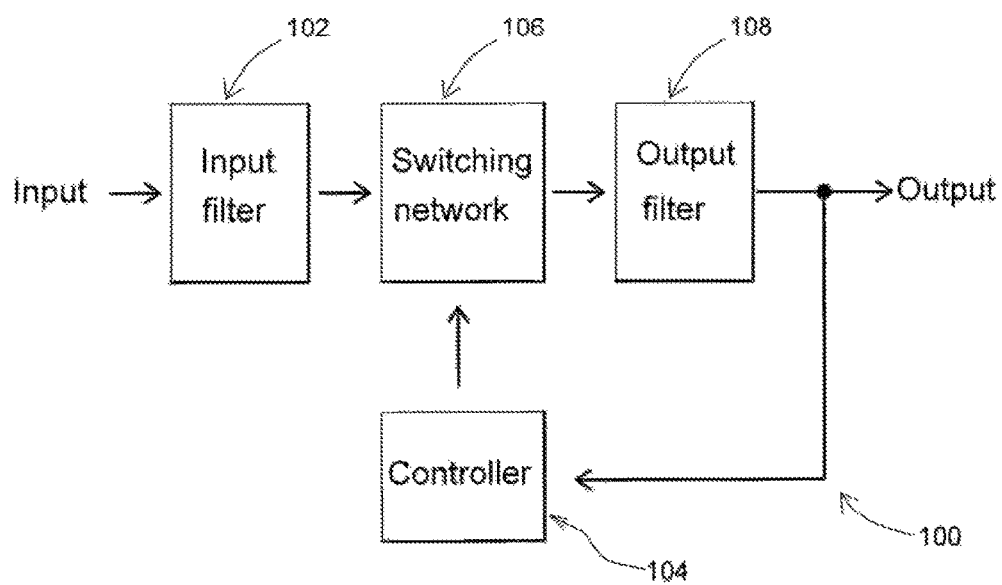
FIG. 1 is a block diagram of an example switched-mode power converter which can be arranged to operate with a system for estimating component parameters in accordance with one embodiment of the present invention.

Referring to FIG. 1, there is illustrated a block diagram of a switched-mode power converter 100. In this embodiment, the switched-mode power converter 100 includes an input filter 102 arranged to perform filtering of an incoming electrical current from a primary power source (e.g. mains power), a switching circuit 106 which is arranged to performing the switching process so as to artificially recreate a desired characteristics of an electric current and output filter 108 which is arranged to filter any undesired noise, excessive current or interference from the artificially recreated electric current and a controller module 104 which is arranged to sample the electric current output from the output filter 108 and adjust, accordingly, the operation of the switching circuit 106 so as to create the desired regulated supply of electric current.

In some other examples, the switched-mode power converter 100 may be arranged to receive an Alternating Current (AC) or Direct Current (DC) and convert this to another AC or DC power supply. Depending on the requirements of a user, a person skilled in the art would appreciate that the switched-mode power converter 100, can be modified to operate to receive and output an AC or DC current as required.

Figure 2:
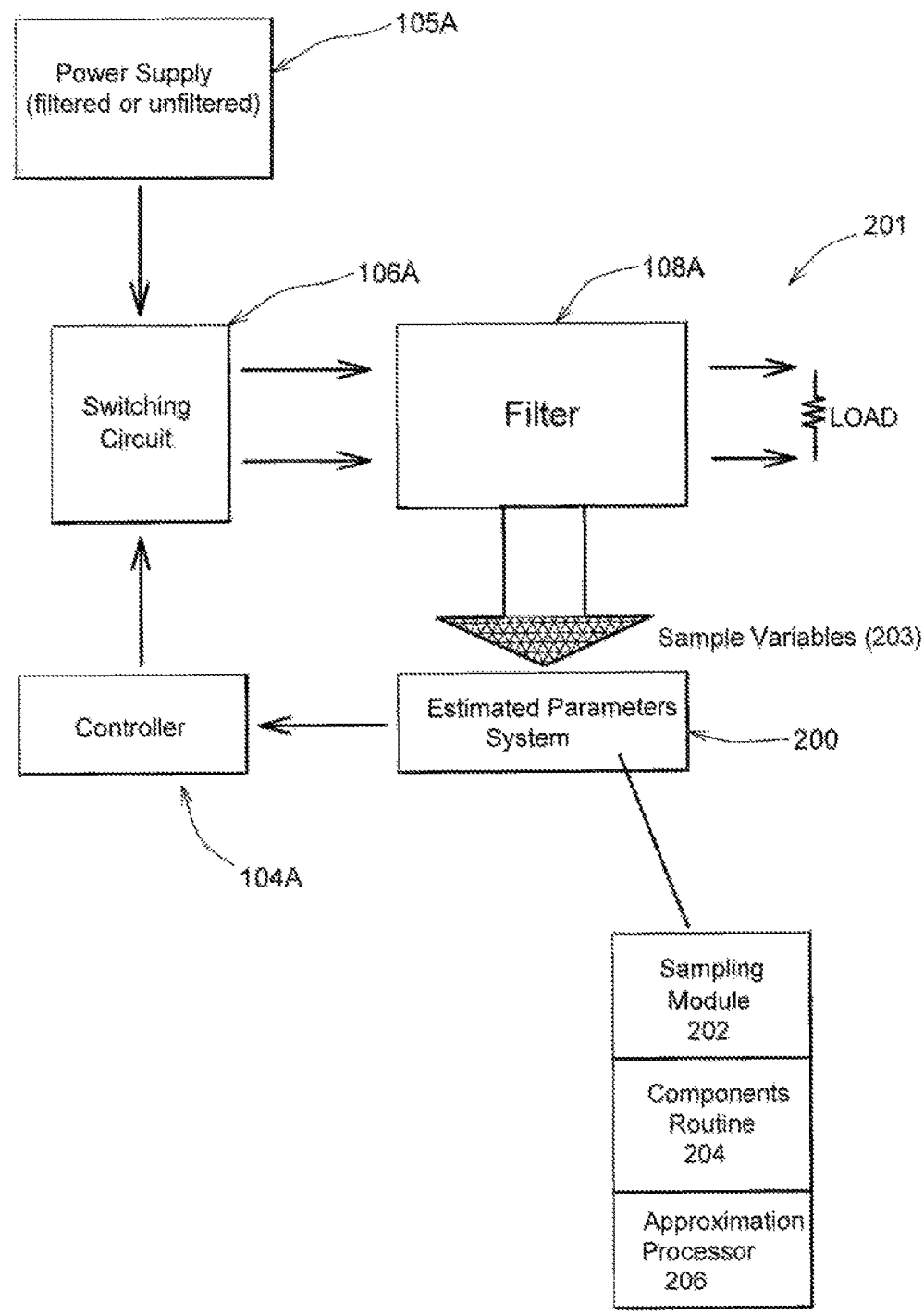
FIG. 2 is a block diagram of an example switched-mode power converter being arranged to operate with an embodiment of a system for estimating component parameters.

With reference to FIG. 2, there is illustrated a block diagram of a switched-mode power converter 201 having an embodiment of a system for estimating component parameters 200. In this embodiment, the system 200 comprises a sampling module 202 arranged to obtain one or more sample variables 203 associated with an electric circuit, which in this example is the electric circuit of a filter 108A. As a person skilled in the art would appreciate, the sample variables 203 may also be associated with any other electric circuit which may or may not operate as a filter.

In this example embodiment, the system 200 also includes a components routine 204 arranged to apply the one or more sample variables 203 to one or more component relationships associated with an arrangement of the electric components of the electric circuit of the filter 108A. Once the sample variables 203 are applied to one of the component relationships, an approximation processor 206 is arranged to process the component relationship with an approximation process to determine one or more estimated component parameters. These component parameters are then applied to another component relationship and processed by the approximation process to determine another estimated component parameter. These steps are repeated until all component parameters required are estimated.

In operation, the system's 200 sampling module 202 is arranged to sample the output filter 108 to obtain one or more sampled variables 203 which are associated with the electric circuit of the filter 108A. As shown in FIG. 2, this is done by a sampling module 202 which is arranged to take specific electrical recordings or measurements of the specific parts of the electric circuit within the filter 108A. In some examples, these electrical recordings or measurements may include:

the input current to the output filter ($i_{in}$);
the output current of the output filter ($i_{out}$); and
the potential difference (voltages) of each node of the filter ($V_n$), wherein the node of the filter may be defined as a junction between each stage of the filter.

The sampling module 202 may take these samples 203 at a pre-determined frequency which is preferably at a frequency less than that of the switching frequency performed by the switching circuit 106. This is advantageous in that the sampling workload is reduced.

Once these sampled variables 203 are obtained by the sampling module 202, the variables 203 are then processed by a component routine 204 which is arranged to apply the one or more sample variables 203 to one or more component relationships associated with an arrangement of the electric components of the electric circuit. These component relationships may outline the mathematical relationship or models of specific components within the electric circuit so that values relating to the performance of components or loads within the filter could be modelled by the component relationships. In one example, sampled variables 203 are applied to component relationships so as to establish a model of the values relating to each of the components within the filter 108A. These component relationships are further described with reference to FIGS. 4 and 5 where examples of component relationships relating to capacitance, inductance and series resistance of capacitors and inductors within an LC filter are described.

In this embodiment, after the sampled variables 203 have been applied to component relationships, an approximation processor 206 may then be arranged to process the component relationships to ascertain values relating to the performance of components or loads within the filter 108A. Since the components relationships model the interaction of components within the filter 108A, the relationships can be solved by the approximation processor 206 so as to ascertain one or more component parameter relating to the performance of the components within the filter 108A. These component parameters relates to the performance of the components within the filter 108A. In one example, the component parameters include the capacitance of the one or more capacitor within the filter 108A, the inductance of one or more inductors within the filter 108 or the series resistance of each of the one or more inductors within the filter 108A.

As some examples of the component relationships within the filter 108A may not be linear, an approximation method, such as the recursive least square technique (RLS) may be used to solve the component relationships to ascertain one or more estimated component parameter. The application of these approximation processes onto component relationships are further described with reference to FIGS. 4 and 5.

Once estimated, the component parameters are in turned supplied to the controller module 104S so as to control the switching module 106A to improve the recreation of the electrical current. This in turn produce a regulated power supply for the output filter 108A and ultimately to a user's electronic/electrical device.

Figure 3:
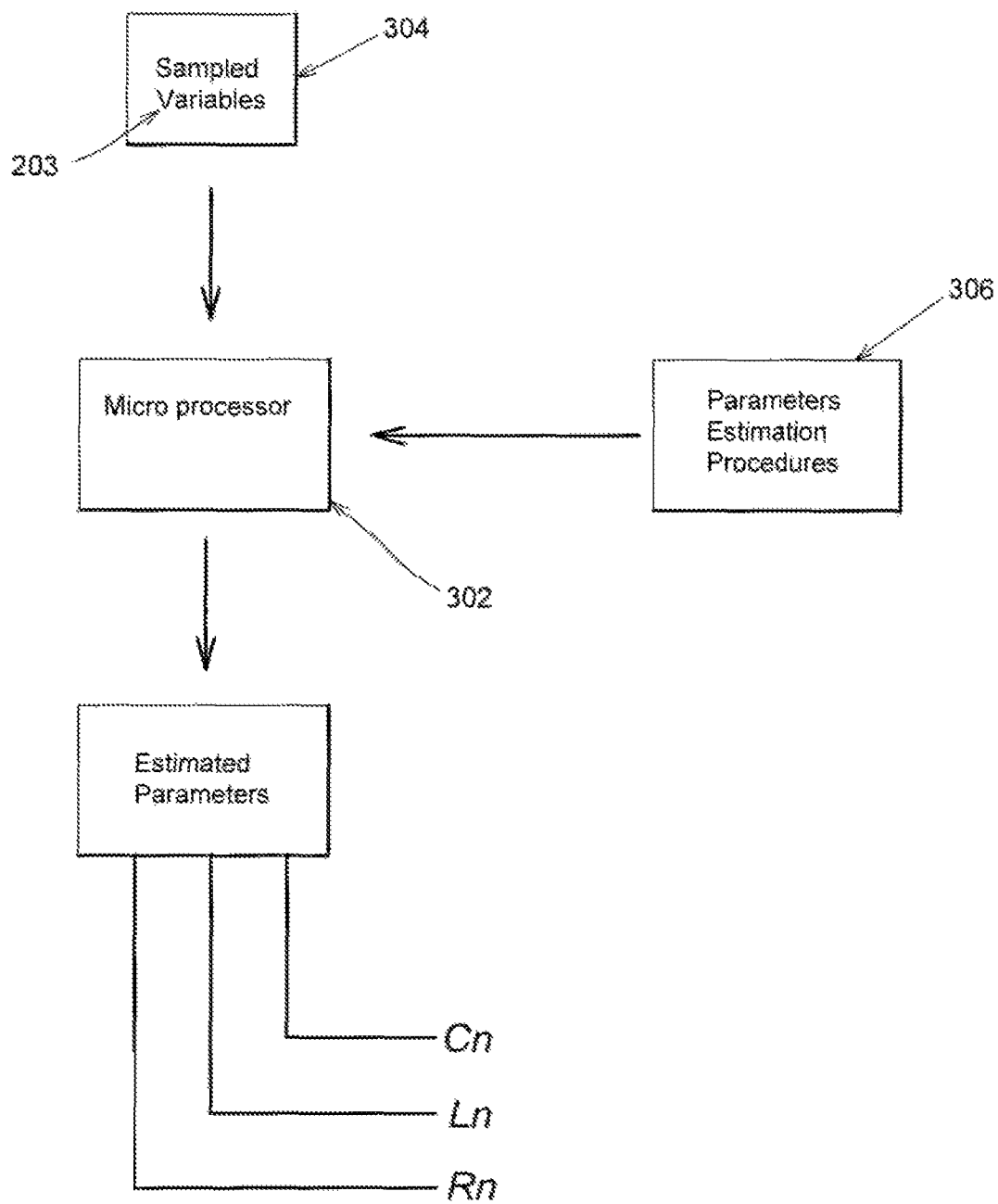
FIG. 3 is a block diagram of the system for estimating component parameters in FIG. 2.

With reference to FIG. 3, there is illustrated a block diagram of the system 200 for estimating component parameters. In this embodiment, the system 200 comprises a microprocessor 302, a variables sampler 304, and a storage device 306 which is arranged to store parameters estimation procedures.

In one example, the system's 200 variables sampler 304 is arranged to obtain sample variables 203 from the filter 108A. These variables, which may include, the input current to the filter 108A ($i_{in}$); the output current of the filter 108A ($i_{out}$); and the potential difference (voltages) of each node of the filter 108A ($V_n$) may be obtained by the sampler 304 through measurement of specific electrical portions of the filter 108A by using a voltmeter, amp-meter, multimeter or oscilloscope on the electrical components or conduits of the filter 108A. The sampler 304 may be programmed or implemented so as to continuously obtain these measurements from the filter 108A at a specific pre-determined frequency.

Once the sample variables 203 are obtained, the variables 203 are supplied to the microprocessor 302 which may be an electronic processing unit arranged to provide a function of computation, arithmetic logic or to execute computer instructions or logic. The microprocessor 302 may then retrieve from the storage device 306 the parameters estimation procedures which may include computer programming instructions associated with an approximation process and component relationships associated with the filter 108A which can be processed to generate a set of estimated component parameters. Further description of these parameters estimation procedures, including the approximation process and component relationships are described with reference to FIGS. 4 and 5.

In this example embodiment, the estimated parameters which are output by the microprocessor 302 includes the Capacitance of the capacitance ($C_n$), the Inductance values of the inductors ($L_n$) and the Series Resistance of the inductors ($R_n$). These are in turned provided to the controller 104A so that a suitable process can be devised to control the switching circuit 106A. This may be completed by classical pulse width modulation scheme or time-domain dynamic control techniques with non-predictive boundary such as those found in H. Sira-Ramirez, G. Escobar, and R. Ortega, "On passivity-based sliding mode control of switched DC-to-DC power converters," in Proc. IEEE Conf. Decision and Control 1996, Kobe, Japan, vol. 3, pp. 2525-2526, December 1996, or predictive boundary or trajectory such as those described in K. Leung and H. Chung, "Derivation of a Second-Order Switching Surface in the Boundary Control of Buck Converters," IEEE Power Electronics Letter, vol. 2, no. 2, pp. 63-67, June 2004;

M. Ordonez, J. E. Quaicoe, and M. T. Iqbal, "Advanced boundary control of inverters using the natural switching surface: normalized geometrical derivation," IEEE Trans. Power Electron., vol. 23, no. 6, pp. 2915-2930, November 2008; and T. H. Li and H. Chung, "Output Current Control for Grid-Connected VSI with LCL filter," International Power Electronics Conference—ECCE—Asia, Sapporo Convention Centre, Sapporo, Japan, 2010, Jun. 21-24, 2010, pp. 1665-1670.

These embodiments are advantageous in that the component parameters can be estimated continuously during the operation of the switched-mode power converter. As component age, changing loads or other operation factors may change these component parameters known at manufacturing, the ability to estimate these component parameters can increase the efficiency and performance of the switched-mode power converter.

Figure 4:
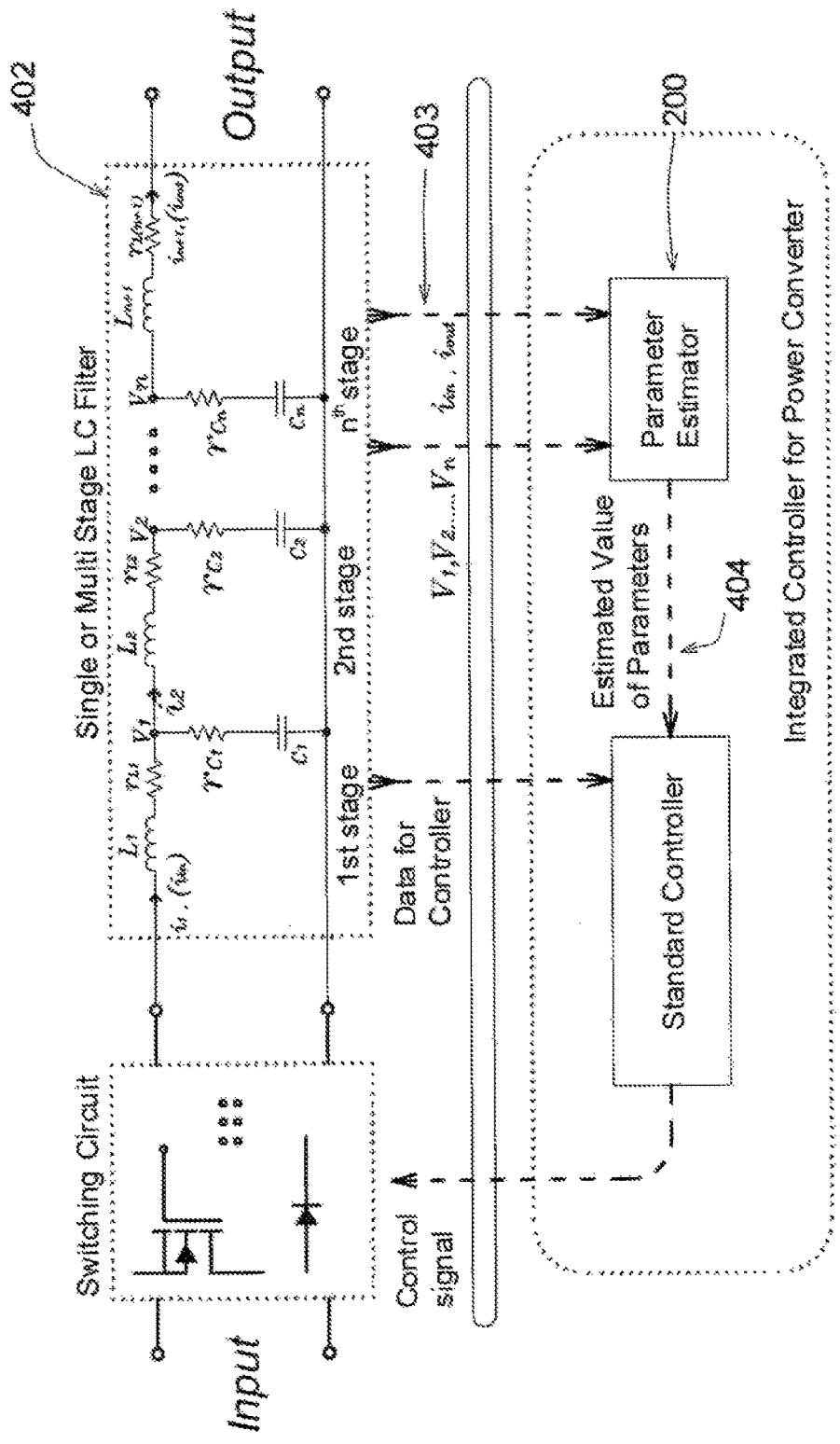
FIG. 4 is a block diagram of another example of a switched-mode power converter being arranged to operate with an embodiment of a system for estimating component parameters.
Figure 5:
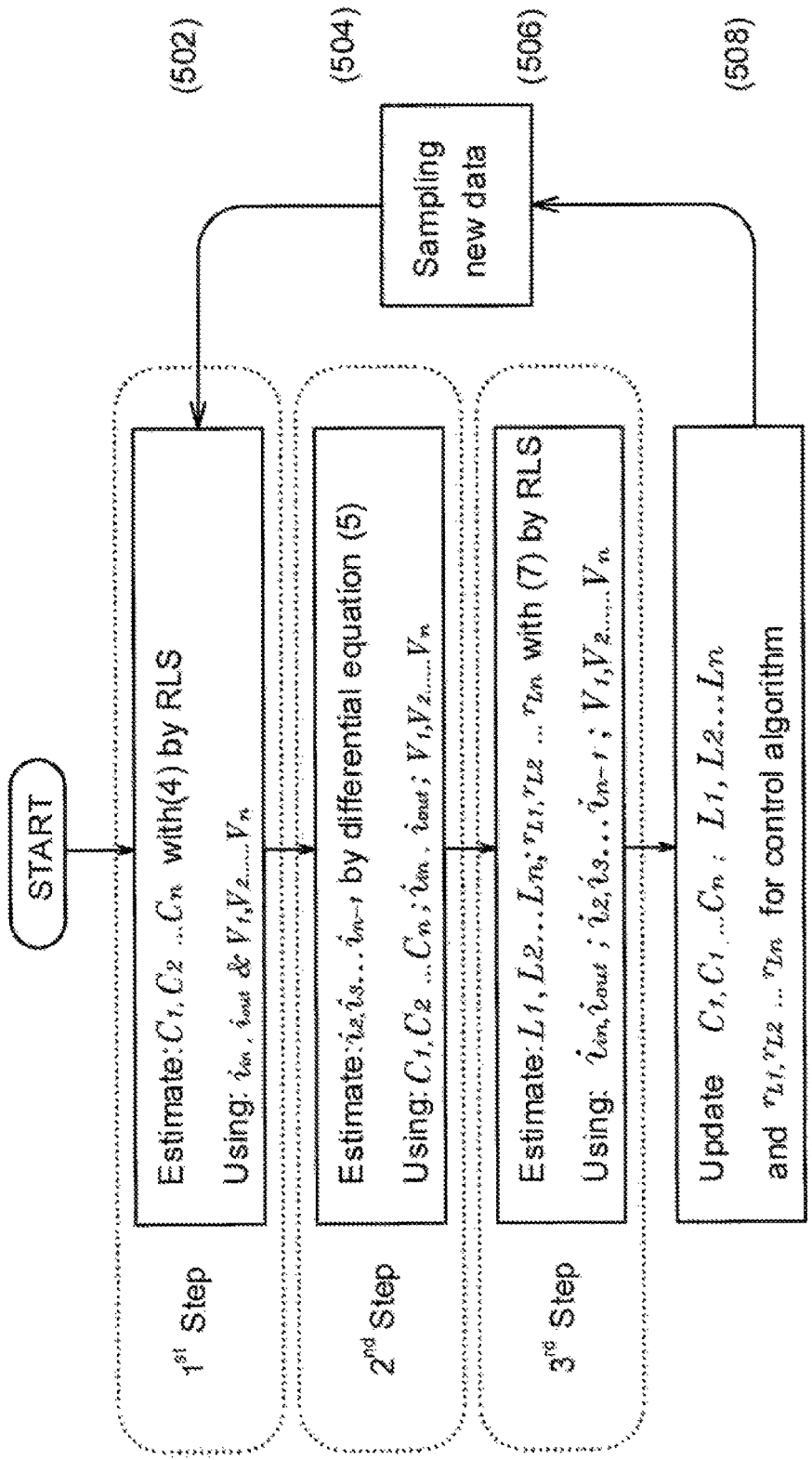
FIG. 5 is a flow diagram illustrating the processes executed by the system for estimating component parameters of FIG. 4.

With reference to FIGS. 4 and 5, there is illustrated an embodiment of the system 200 in use with an LC filter 402 of a switched-mode power converter. In this embodiment, the system 200 is arranged to, at a predetermined frequency less than the switching frequency of the switching module, obtain sampled variables 403 including $i_{in}$, $i_{out}$ and $V_n$ of the LC filter 402 wherein:

$i_{in}$ is the input current to the LC filter 402;

$i_{out}$ is the output current of the LC Filter 402;

$V_n$ is the voltages of the nodes of the LC filter 402, that is the nodes between an inductor and an associated capacitor within a specific order (n) of the LC filter 402, or otherwise between each stage of the LC filter 402.

Once these sampled variables 403 are obtained, specific process steps are performed by the system's 200 components routine 204 and approximation processor 206 so as to generate estimated parameters 404 relating to electrical components of filter 402. As shown below, and with reference to FIGS. 4 and 5, the sampled variables 403 are applied to a number of component relationships and in turn, solved by an approximation process to obtain a set of estimated parameters relating to electrical components of the filter. In this embodiment, three steps are used to generate the estimated parameters 403, with the result of each step being applied to the next step until all of the estimated component parameters 403 are determined.

To initiate the determination of the component parameters 403, an approximation process is firstly selected. In this example embodiment, a recursive least square (RLS) process is used to solve for θ in the equation formed as (1)

$$y_k = \Phi_k^T \theta + \varepsilon_k \quad (1)$$

The RLS is used in the following steps to generate estimated parameter components. These steps, which are illustrated in a flow diagram of FIG. 5 are as follows:

1$^{st}$ Step: Estimation of the Values of the Capacitors (502)

The values of the capacitances of each of the capacitors in the filter 402 $C_1, C_2, \ldots C_n$ are estimated by using the terminal currents $i_{in}$ and $i_{out}$ and node voltages, $V_1, V_2, \ldots V_n$. The terminal currents and node voltages of the filter 402 can be expressed in this component relation which is mathematically described as follows (2), $$i_{in} - i_{out} = C_1 \frac{d(v_1 - v_{rc1})}{dt} + C_2 \frac{d(v_2 - v_{rc2})}{dt} + \ldots C_n \frac{d(v_n - v_{rcn})}{dt}. \quad (2)$$

By integrating (2), defining $\Delta i = (i_{in} - i_{out})$ and $\Delta V_n(t) = V_n(t) - V_n(0),$ it can be shown that $\int_0^{t_1} \Delta i(t) dt = [C_1 \Delta V_1(t_1) + C_2 \Delta V_2(t_1) + \ldots C_n \Delta V_n(t_1)] + u(t_1)$ (3), wherein u is zero-mean random "noise" due to ESR of capacitors, which can be neglected in RLS. The discrete form of (3) for estimation of $C_n$ is as follows, $$T \sum_{j=1}^{k} \frac{\Delta i(j) + \Delta i(j-1)}{2} = C_1 \Delta v_1(k) + C_2 \Delta v_2(k) + \ldots C_n \Delta v_n(k) \quad (4)$$

where T is sampling period of discrete signal.

Equation (4) can then be solved using the RLS method by defining elements in (1) as:

$$y_k = T \sum_{j=1}^{k} \frac{\Delta i(j) + \Delta i(j-1)}{2};$$

$$\Phi_k = [\Delta v_1(k), v_2(k), \cdots v_n(k)]^T; \theta = [C_1, C_2, \cdots C_n]^T$$

Thus in this example embodiment, the completion of this step would provide the estimated parameters of the capacitance of each of the capacitors $C_1, C_2, \ldots C_n$ within the filter 402.

$2^{nd}$ Step: Estimation of the Inductor Currents (504)

Once the capacitance of each of the capacitors are estimated in step 1 described above, the next step (step 2) is to estimate the currents flowing through the inductors. In this example, this step is based on the values of capacitors estimated in the first step and data sampled.

By neglecting the voltage drop across the Equivalent Series Resistance (ESR) of the capacitors, the inductor current in each stage can then be calculated by using another component relationship which utilizes the current obtained in its previous stage. This component relationship can be expressed as, $$i_{n+1} = i_n - C_n \frac{dv_n}{dt} \quad (5)$$

$3^{rd}$ Step: Estimation of the Inductor Value and Series Resistance (506)

Once the inductor current $i_n$ is generated based on the component relationship (2), the inductance and series resistance of each inductor can then be estimated by using another component relationship which applies the currents estimated in the second step and node voltages. This component relationship can be expressed in the following relationship (6) wherein $L_n$ is the inductance of a specific inductor at "n" stage:

$L_n \Delta i_n(t_1) = \int_0^{t_1} [V_{Ln}(t) - r_{Ln} i_n(t)] dt$ (6)

where $\Delta i_n(t) = i_n(t) - i_n(0)$ and $V_{Ln}(t) = V_{n-1}(t) - V_n(t).$

The discrete form of (6) may be expressed as:

$$T \sum_{j=1}^{k} \frac{v_{Ln}(j) + v_{Ln}(j-1)}{2} = L_n \Delta i_n(k) + r_{Ln} T \sum_{j=1}^{k} \frac{i_n(j) + i_n(j-1)}{2} \quad (7)$$

where T is sampling period of discrete signal. Equation (7) can be solved using RLS method by defining elements in (1) as:

$$y_k = T \sum_{j=1}^{k} \frac{v_{Ln}(j) + v_{Ln}(j-1)}{2};$$

$$\Phi_k = \left[ \Delta i_n, T \sum_{j=1}^{k} \frac{i_n(j) + i_n(j-1)}{2} \right]^T; \theta = [L_n, r_{Ln}]^T$$

Once equation (7) is solved by the RLS, the inductance and series resistance of a specific inductor at "n" stage of the filter 402 can be estimated. Therefore, based on the above three steps (502 to 506) and the application of the RLS process to solve for parameters, the follow component parameters are estimated:

1—the capacitance of each capacitor at each stage of the filter 402;

2—the inductance of each inductor at each stage of the filter 402; and

3—the series resistance of each inductor at each stage of the filter 402.

These component parameters may then be directly inputted back into the controller (508) which in turn can be used by the controller to control the switching circuit and thereby improve the quality of the electric current being delivered to the filter 402. A new sampling of sampled variables ($i_{in}$, $i_{out}$ and $V_n$) by the system 200 may also take place at a specific frequency, which is preferably lower than that of the switching frequency of the switching module. Once a new sampling of these sampled variables are obtained, the system 200 can proceed to determine the estimated component parameters and resupply these to the controller, and thus create a continuous feedback to the controller so as to continually improve the quality of the electrical supply.

Techniques such as the Time-domain dynamic control techniques with non-predictive boundary or predictive boundary or trajectory or classical pulse width modulation scheme may be used by a switched-mode power converter's controller to control the switching module. These techniques may provide fast transient response to large-signal disturbances, such as startup, load and reference disturbances when the switched-mode power converter is in use. However, these advantages are offset by the drawback that the boundary control algorithm requires precise information about the component parameters of the converter's output filter. The parameter error introduced in manufacturing as well as component tolerance, parameter drift in long-term operation due to thermal and aging can affect the performance of those optimal control methods. These embodiments described herein may offer some advantages in that a switched-mode power converter which includes the system to estimated component parameters 200 are able to obtain accurate estimates of the actual filter parameters and thus be able to improve the control of the switching module to improve the quality of the power supply. In addition, the embodiments of the system 200 when used with a switched-mode power supply may also able to at least offer one or more of the following advantages:

1. Only intermediate node voltage(s) and input and output currents are sampled. Thus, implementation of the estimator is simple.
2. The sampling frequency is lower than the switching frequency.
3. No fast computation is needed.

Furthermore, based on items 2) and 3), only low-cost microcontroller is needed.

Experimental Result

Embodiments of the system 200 have been applied to a buck converter with a two-stage LC filter. In one example, the buck converter has a 2-stage LC filter and is utilized to supply power to a changing load. The parameters of operation are:

input voltage is 30V; and
switching frequency is 20 kHz with 0.5 duty-cycle.

The values of the components measured by a capacitance-voltage meter, model HP4194 are $C_1=47$ µF, $C_2=60$ µF, $L_1=5$ mH, $r_{L1}=4\Omega$, $L_2=5$ mH and $r_{L2}=3.7\Omega$. Data samples are recorded when there are system disturbances (load resistance changing between 20Ω and 4Ω at 120 Hz with 0.5 duty-cycle). The sampling frequency is 16.67 kHz.

TABLE I

Estimation results of a 2-stage LC filter.

| Component | $L_1$ | $r_{L1}$ | $L_2$ | $r_{L2}$ | $C_1$ | $C_2$ |
|---|---|---|---|---|---|---|
| Actual value | 5 mH | 4Ω | 5 mH | 3.7Ω | 47 µF | 60 µF |
| Estimated value | 4.90 mH | 4.07Ω | 4.91 mH | 3.72Ω | 48.1 µF | 58.3 µF |
| Error | 2.0% | 1.8% | 1.8% | 0.5% | 2.3% | 2.8% |

Figure 6A:
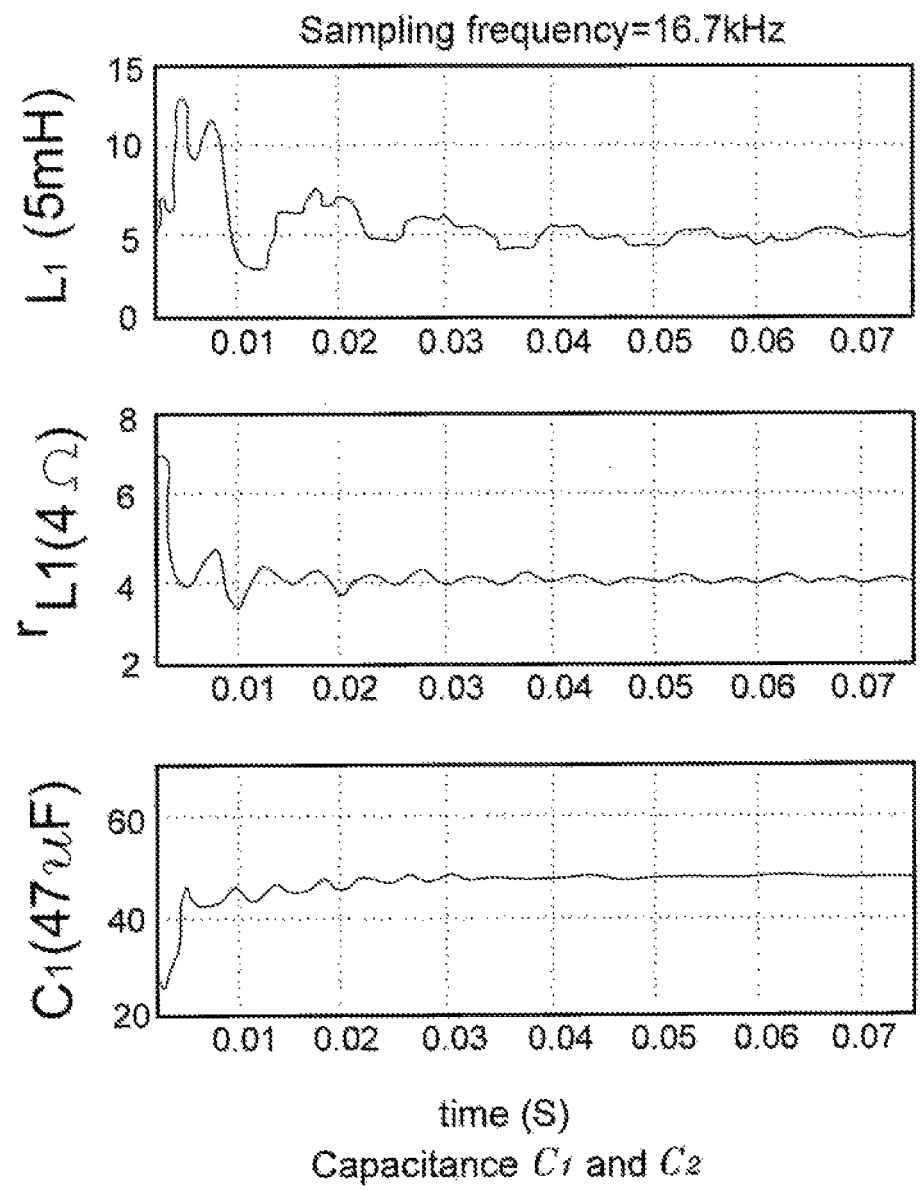
FIGS. 6A and 6B are graphical plots of component parameters in accordance with one example operations of the switched-mode power converter of FIG. 4.
Figure 6B:
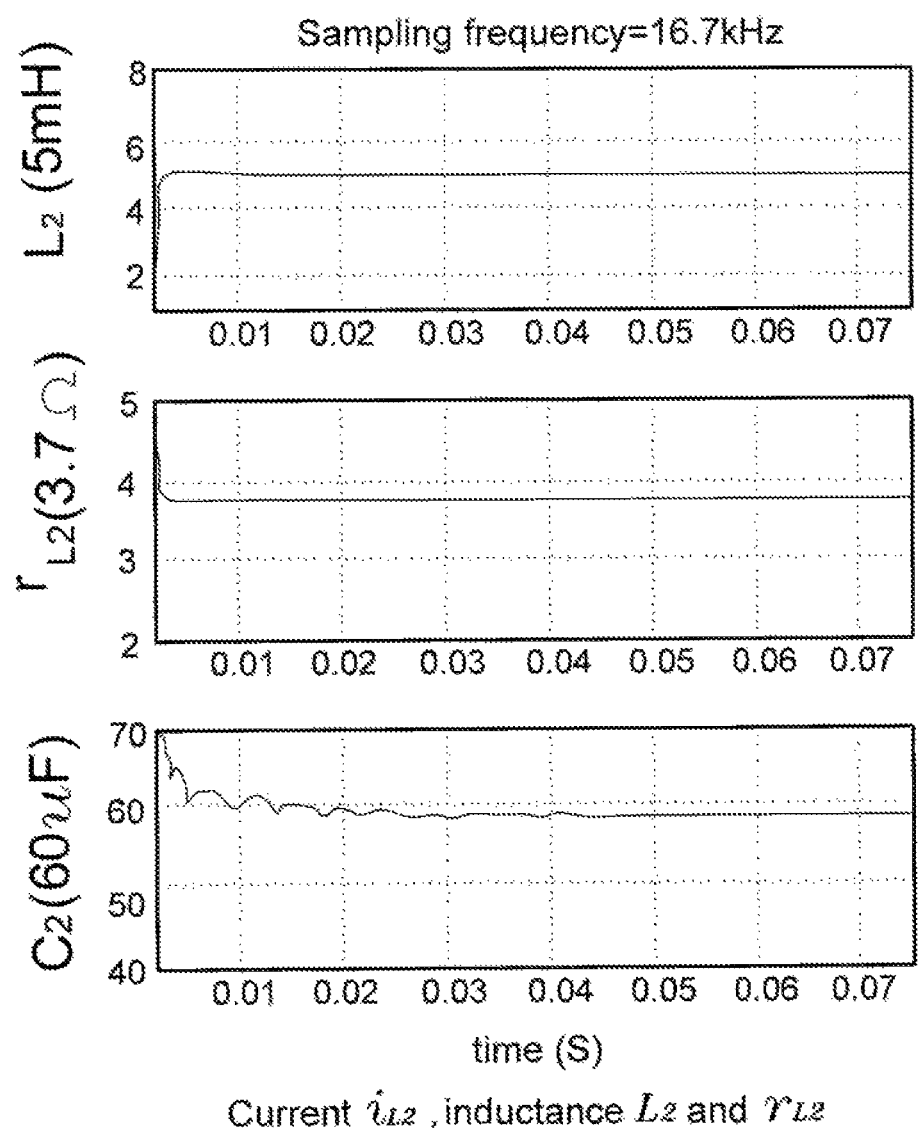

FIGS. 6A and 6B shows the estimated values of the components. As it can be seen in Table I, the estimation errors are less than 3% for all estimation targets as shown in Table I.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present invention are either wholly implemented by computing system or partly implemented by computing systems then any appropriate computing system architecture may be utilised. This will include stand alone computers, network computers and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for controlling a power supply with a plurality of estimated component parameters relating to electric components of an electric circuit comprising the steps of:

receiving one or more sample variables associated with the electric circuit;

applying the one or more sample variables to a plurality of component relationships associated with an arrangement of the electric components of the electric circuit;

processing the plurality of component relationships with an approximation process to determine the one or more estimated component parameters, wherein the approximation process is a recursive least square process;

providing the plurality of estimated component parameters to a controller arranged to control a switching module of the power supply; and controlling the switching module of the power supply with the plurality of estimated component parameters;

wherein the plurality of estimated component parameters are determined during an operation of the switching module;

wherein the electric circuit is a LC filter comprising one or more inductors and one or more capacitors; and wherein the plurality of estimated component parameters include:

a capacitance value associated with each of the one or more capacitors;

an inductance value associated with each of the one or more inductors; and a series resistance value associated with each of the one or more inductors;

wherein the plurality of component relationships include:

a capacitance relationship arranged to be applied with the recursive least square process to derive one or more capacitance values associated with one or more capacitors, wherein the capacitance relationship is given by:

$$i_{in} - i_{out} = C_1 \frac{d(v_1 - v_{rc1})}{dt} + C_2 \frac{d(v_2 - v_{rc2})}{dt} + \ldots C_n \frac{d(v_n - v_{rcn})}{dt},$$

wherein:
($i_{in}$) is the input current to the electric circuit;
($i_{out}$) is the output current to the electric circuit;
($v_n$) is the node voltages of one or more nodes of the electric circuit;
($v_{rcn}$) is the voltage drop corresponding to the ESR of a respective one of the one or more capacitors; and
$C_1, C_2, \ldots, C_n$ are estimated capacitance values of each of the capacitors in the electric circuit an inductor current relationship to derive one or more inductor current values associated with each of the one or more inductors, wherein the inductor current relationship is given by:

$$i_{n+1} = i_n - C_n \frac{dv_n}{dt},$$

wherein:
- ($i_{n+1}$) is the input current to a next inductor in series;
- ($i_n$) is the output current to the inductor;
- ($C_n$) is the capacitance value of the capacitor associated with the inductor derived in a previous step with the capacitance relationship; and
- ($dv_n/dt$) is the change in voltage across the capacitor over time; and an inductance relationship to derive one or more inductance values and series resistance values associated with each of the one or more inductors; wherein the inductance relationship is given by:

$$L_n \Delta i_n(t_1) = \int_0^{t_1} [v_{Ln}(t) - r_{Ln} i_n(t)] dt,$$

wherein:
- $L_n$ is the inductance of the inductor;
- $i_n$ is the current flowing into the inductor as derived in the previous step with the inductor current relationship;
- t is the time variable;
- $\Delta i_n(t_1)$ is the change of the current flowing through the inductor from time 0 to time $t_1$ derived in the previous step with the inductor current relationship;
- $v_{Ln}$ potential difference across the inductor; and
- $r_{Ln}$ is the series resistance of the inductor.

2. A method for estimating component parameters in accordance with claim 1, wherein the one or more sample variables are associated with an input current to the electric circuit, an output current to the electric circuit and node voltages of one or more nodes of the electric circuit.

3. A method for estimating component parameters in accordance with claim 1, wherein the one or more nodes of the electric circuit are defined by an electrical joint between a capacitor and an inductor.

4. A method for estimating component parameters in accordance with claim 1, wherein the inductance relationship is processed by the recursive least squares process to derive the one or more inductance values and the series resistance values associated with each of the one or more inductors.

5. A system for controlling a power supply with a plurality of estimated component parameters relating to electric components of an electric circuit comprising:
- a sampling module arranged to obtain one or more sample variables associated with the electric circuit;
- a routine arranged to apply the sample variables to a plurality of component relationships associated with an arrangement of the electric components of the electric circuit;
- a processor arranged to process the plurality of component relationships with an approximation process to determine the plurality of estimated component parameters, wherein the approximation process is a recursive least square process; and
- a controller arranged to control a switching module of the power supply with the plurality of estimated component parameters;

wherein the plurality of estimated component parameters are determined during an operation of the switching module;

wherein the electric circuit is a LC filter comprising one or more inductors and one or more capacitors; and wherein the plurality of estimated component parameters include:
- a capacitance value associated with each of the one or more capacitors;
- an inductance value associated with each of the one or more inductors; and
- a series resistance value associated with each of the one or more inductors;

wherein the plurality of component relationships include:
- a capacitance relationship arranged to be applied with the recursive least square process to derive one or more capacitance values associated with one or more capacitors, wherein the capacitance relationship is given by:

$$i_{in} - i_{out} = C_1 \frac{d(v_1 - v_{rc1})}{dt} + C_2 \frac{d(v_2 - v_{rc2})}{dt} + \ldots C_n \frac{d(v_n - v_{rcn})}{dt},$$

wherein:
- ($i_{in}$) is the input current to the electric circuit;
- ($i_{out}$) is the output current to the electric circuit;
- ($v_n$) is the node voltages of one or more nodes of the electric circuit;
- ($v_{rcn}$) is the voltage drop corresponding to the ESR of a respective one of the one or more capacitors; and
- $C_1, C_2, \ldots, C_n$ are estimated capacitance values of each of the capacitors in the electric circuit an inductor current relationship to derive one or more inductor current values associated with each of the one or more inductors, wherein the inductor current relationship is given by:

$$i_{n+1} = i_n - C_n \frac{dv_n}{dt},$$

wherein:
- ($i_{n+1}$) is the input current to a next inductor in series;
- ($i_n$) is the output current to the inductor;
- ($C_n$) is the capacitance value of the capacitor associated with the inductor derived in a previous step with the capacitance relationship; and
- ($dv_n/dt$) is the change in voltage across the capacitor over time; and an inductance relationship to derive one or more inductance values and series resistance values associated with each of the one or more inductors; wherein the inductance relationship is given by:

$$L_n \Delta i_n(t_1) = \int_0^{t_1} [v_{Ln}(t) - r_{Ln} i_n(t)] dt,$$

wherein:
- $L_n$ is the inductance of the inductor;
- $i_n$ is the current flowing into the inductor as derived in the previous step with the inductor current relationship;

t is the time variable;

$\Delta i_n(t_1)$ is the change of the current flowing through the inductor from time 0 to time $t_1$ derived in the previous step with the inductor current relationship;

$v_{Ln}$ is the potential difference across the inductor; and $r_{Ln}$ is the series resistance of the inductor.

6. A system for estimating component parameters in accordance with claim 5, wherein the one or more component relationships is associated with an arrangement of the electric components of the electric circuit.

7. A system for estimating component parameters in accordance with claim 5, wherein the one or more sample variables are associated with an input current to the electric circuit, an output current to the electric circuit and node voltages of one or more nodes of the electric circuit.

8. A system for estimating component parameters in accordance with claim 5, wherein the one or more nodes of the electric circuit are defined by an electrical joint between a capacitor and an inductor.

9. A system for estimating component parameters in accordance with claim 5, wherein the inductance relationship is processed by the recursive least squares process to derive the one or more inductance values and the series resistance values associated with each of the one or more inductors.

10. A system for estimating component parameters in accordance with claim 5, wherein the plurality of estimated component parameters are provided to a controller arranged to control a switching module of a switched mode power supply.

11. A switched-mode power supply comprising a system for estimating component parameters in accordance with claim 5.

* * * * *